(12) United States Patent
Fan (10) Patent No.: US 10,382,053 B2
(45) Date of Patent: Aug. 13, 2019

(54) CAPACITIVE SUCCESSIVE APPROXIMATION ANALOG-TO-DIGITAL CONVERTER

(71) Applicant: SHENZHEN GOODIX TECHNOLOGY CO., LTD., Shenzhen (CN)

(72) Inventor: Shuo Fan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/119,739

(22) Filed: Aug. 31, 2018

(65) Prior Publication Data

US 2019/0020351 A1 Jan. 17, 2019

Related U.S. Application Data

(63) Continuation of application No. PCT/CN2017/085370, filed on May 22, 2017.

(51) Int. Cl.
*H03M 1/46* (2006.01)
*H03M 1/80* (2006.01)

(52) U.S. Cl.
CPC .......... *H03M 1/462* (2013.01); *H03M 1/468* (2013.01); *H03M 1/804* (2013.01)

(58) Field of Classification Search
CPC .............................. H03M 1/462; H03M 1/468
See application file for complete search history.

(56) References Cited

U.S. PATENT DOCUMENTS

2004/0227654 A1* 11/2004 Yang ................... H03M 1/682
341/172
2008/0036641 A1* 2/2008 Confalonieri ....... H03M 1/0682
341/172
(Continued)

FOREIGN PATENT DOCUMENTS

CN 104218952 A 12/2014
CN 105978571 A 9/2016
(Continued)

OTHER PUBLICATIONS

Zhang Jin et al: "99.2% energy saving and high-linearity switching method for SAR ADCs", Analog Integrated Circuits and Signal Processing, Springer New York LLC, US, vol. 91, No. 1, Dec. 5, 2016, pp. 93-96, XP036186519, ISSN: 0925-1030, DOI: 10.1007/S10470-016-0895-X *Section 2; figure 2*.
(Continued)

*Primary Examiner* — Howard Williams (57) ABSTRACT

A capacitive successive approximation analog-to-digital converter is provided, where the capacitive successive approximation analog-to-digital converter includes a first capacitor array including N first capacitors; a second capacitor array including N second capacitors; a voltage generation circuit configured to generate a common mode voltage, a reference voltage, a first voltage and a second voltage; a first switch, a second switch, N third switches and N fourth switches; a comparator including a first input end, a second input end and an output end, where upper plates of the N first capacitors are connected to the first input end and upper plates of the N second capacitors are connected to the second input end; and a successive approximation logic controller connected to the output end of the comparator. The capacitive successive approximation analog-to-digital converter in
(Continued)

the above technical solution can use 2N capacitors to implement outputting an N-bit binary code.

8 Claims, 3 Drawing Sheets

(56) References Cited

U.S. PATENT DOCUMENTS

| | | | |
|---|---|---|---|
| 2010/0142653 A1* | 6/2010 | Furuta | H03M 1/0682 375/340 |
| 2015/0244383 A1 | 8/2015 | Kull et al. | |
| 2015/0295586 A1 | 10/2015 | Kull et al. | |
| 2018/0183457 A1* | 6/2018 | Lee | H03M 1/0678 |

FOREIGN PATENT DOCUMENTS

| | | |
|---|---|---|
| CN | 205596102 U | 9/2016 |
| CN | 106059589 A | 10/2016 |

OTHER PUBLICATIONS

Liu Shubin et al: "A 12-Bit 10 MSs SAR ADC With High Linearity and Energy-Efficient Switching", IEEE Transactions on Circuits and Systems I: Regular Papers, IEEE, US, vol. 63, No. 10, Oct. 2016, pp. 1616-1627, XP011624284, ISSN: 1549-8328, DOI: 10.1109/TCSI.2016.2581177 *Section II and III; figures 1, 2*.

Tong X Y et al: "Low-energy and area-efficient switching scheme for SAR AD converter", Analog Integrated Circuits and Signal Processing, Springer New York LLC, US, vol. 80, No. 1, Apr. 12, 2014, pp. 153-157, XP035317603, ISSN: 0925-1030, DOI: 10.1007/S10470-014-0300-6 *Section 2; figure 1*.

* cited by examiner

CAPACITIVE SUCCESSIVE APPROXIMATION ANALOG-TO-DIGITAL CONVERTER

CROSS-REFERENCE TO RELATED TO APPLICATIONS

The present disclosure is a continuation of international application No. PCT/CN2017/085370, filed on May 22, 2017, which is hereby incorporated by reference in its entirety.

TECHNICAL FIELD

Embodiments of the present application relate to a field of electronic technologies, in particular to a capacitive successive approximation analog-to-digital converter.

BACKGROUND

A successive approximation analog-to-digital converter (Successive Approximation Analog-to-digital Converter, referred to as "SAR ADC" for short) is a device that converts an analog signal into a digital signal.

A capacitive SAR ADC is a common SAR ADC, and accuracy of the capacitive SAR ADC is correlated with a total capacitance therein. Currently, if a capacitive SAR ADC is required to output an output result with an accuracy of an N-bit binary encode, two capacitor arrays consisting of N+1 capacitors need to be included. Capacitances of the capacitors in the capacitor array are in an exponential relation. Specifically, capacitances of the N+1 capacitors in the capacitor arrays meet the following relationship:

$$\begin{cases} C_1 = C, \\ C_n = 2^{n-2}C, N+1 \geq n \geq 2 \end{cases} \quad \text{(Formula 1.1)}$$

where C denotes a unit capacitance. Therefore, a total capacitance in one capacitor array is $2^N C$.

SUMMARY

Embodiments of the present application provide a capacitive SAR ADC that may reduce a number of capacitors used in the SAR ADC and a total capacitance.

According to a first aspect, an embodiment of the present application provides a capacitive successive approximation analog-to-digital converter, including: a first capacitor array including N first capacitors, where N is a number of bits of a binary code output by the capacitive successive approximation analog-to-digital converter, and N is a positive integer greater than or equal to 3; a second capacitor array including N second capacitors; a voltage generation circuit configured to generate a common mode voltage, a reference voltage, a first voltage and a second voltage, where the first voltage is determined according to the common mode voltage and the reference voltage, and the second voltage is determined according to the common mode voltage and a ground voltage; a first switch connected between the voltage generation circuit and upper plates of the N first capacitors; a second switch connected between the voltage generation circuit and upper plates of the N second capacitors; N third switches correspondingly connected to lower plates of the N first capacitors respectively to control connections of the lower plates of the first capacitors with the voltage generation circuit and an output end of a first sampling voltage; N fourth switches correspondingly connected to lower plates of the N second capacitors respectively to control connections of the lower plates of the first capacitors with the voltage generation circuit and an output end of a second sampling voltage; a comparator including a first input end, a second input end and an output end, where the upper plates of the N first capacitors are connected to the first input end and the upper plates of the N second capacitors are connected to the second input end, and the comparator is configured to compare a voltage value received by the first input end with a voltage value received by the second input end and output N comparison results respectively corresponding to an N-bit binary code outputted via the output end of the comparator; and a successive approximation logic controller connected to the output end of the comparator to control the first switch, the second switch, the N third switches and the N fourth switches to enable the first capacitor array and the second capacitor array to be in a sampling mode or a comparison mode.

In combination with the first aspect, in a first possible implementation manner of the first aspect, the first voltage is determined according to the following formula: $V_1 = 0.5 \times (V_{cm} + V_{ref})$, where $V_1$ denotes the first voltage, $V_{cm}$ denotes the common mode voltage, and $V_{ref}$ denotes the reference voltage; and the second voltage is determined according to the following formula: $V_2 = 0.5 \times (V_{cm} + V_{gnd})$, where $V_2$ denotes the second voltage and $V_{gnd}$ denotes a ground voltage.

In combination with the first aspect, in a second possible implementation manner of the first aspect, the successive approximation logic controller is specifically configured to control the first switch, the second switch, the N third switches and the N fourth switches during a sampling period to enable the N first capacitors and the N second capacitors to operate in a sampling mode.

In combination with the second possible implementation manner of the first aspect, in a third possible implementation manner of the first aspect, the successive approximation logic controller is specifically configured to, after the sampling period is completed, control the first switch, the second switch, the N third switches and the N fourth switches to enable the N first capacitors and the N second capacitors to operate in an $n^{th}$ comparison mode, where n=1, ..., N; and the comparator is specifically configured to, in a case that the N first capacitors and the N second capacitors operate in the $n^{th}$ comparison mode, compare the voltage value received by the first input end of the comparator with the voltage value received by the second input end of the comparator, determine an $n^{th}$ comparison result of the N comparison results and output the $n^{th}$ comparison result to the successive approximation logic controller, where the $n^{th}$ comparison result corresponds to an $(N-n+1)^{th}$ bit of the N-bit binary code.

In combination with the third possible implementation manner of the first aspect, in a fourth possible implementation manner of the first aspect, the successive approximation logic controller is specifically configured to: during the sampling period, control the first switch to be turned on to enable an upper plate of each of the N first capacitors to be connected to a third output end of the voltage generation circuit, control the second switch to be turned on to enable an upper plate of each of the N second capacitors to be connected to the third output end of the voltage generation circuit, control the N third switches to enable a lower plate of each of the N first capacitors to be connected to an output end of the first sampling voltage, and control the N fourth switches to enable a lower plate of each of the N second capacitors to be connected to an output end of the second sampling voltage, so that the N first capacitors and the N second capacitors operate in the sampling mode, and the third output end of the voltage generation circuit outputs the common mode voltage.

In combination with the fourth possible implementation manner of the first aspect, in a fifth possible implementation manner of the first aspect, the successive approximation logic controller is specifically configured to: after the sampling period is completed, control the first switch to be turned off to enable the upper plate of each of the N first capacitors to be disconnected from the third output end of the voltage generation circuit, control the second switch to be turned off to enable the upper plate of each of the N second capacitors to be disconnected from the third output end of the voltage generation circuit, control the N third switches to enable the lower plate of each of the N first capacitors to be connected to the third output end of the voltage generation circuit, and control the N fourth switches to enable the lower plate of each of the N second capacitors to be connected to the third output end of the voltage generation circuit, so that the N first capacitors and the N second capacitors operate in a first comparison mode; according to a first comparison result output by the comparator, control the N third switches to enable the lower plate of each of the N first capacitors to be connected to a second output end of the voltage generation circuit and control the N fourth switches to enable the lower plate of each of the N second capacitors to be connected to a first output end of the voltage generation circuit, or, control the N third switches to enable the lower plate of each of the N first capacitors to be connected to a first output end of the voltage generation circuit and control the N fourth switches to enable the lower plate of each of the N second capacitors to be connected to a second output end of the voltage generation circuit, so that the N first capacitors and the N second capacitors operate in a second comparison mode; and according to the first comparison result and an $(m-1)^{th}$ comparison result output by the comparator, control an $(m-2)^{th}$ third switch of the N third switches to enable a lower plate of an $(m-2)^{th}$ first capacitor of the N first capacitors to be connected to a ground end, the third output end of the voltage generation circuit or a fourth output end of the voltage generation circuit, control an $(m-2)^{th}$ fourth switch of the N fourth switches to enable a lower plate of an $(m-2)^{th}$ second capacitor of the N second capacitors to be connected to the ground end, the third output end of the voltage generation circuit or the fourth output end of the voltage generation circuit, so that the N first capacitors and the N second capacitors operate in an $m^{th}$ comparison mode, where m=3, . . . , N, where the first output end of the voltage generation circuit outputs the first voltage, the second output end of the voltage generation circuit outputs the second voltage, and the fourth output end of the voltage generation circuit outputs the reference voltage.

In combination with the first aspect or any one of the above possible implementation manner of the first aspect, in a sixth possible implementation manner of the first aspect, a capacitance of a first one of the N first capacitors is C, a capacitance of a $k^{th}$ one of the N first capacitors is $2^{k-2}C$, a capacitance of a first one of the N second capacitors is C, and a capacitance of a $k^{th}$ one of the N second capacitors is $2^{k-2}C$, where k=2, . . . , N, and C is a unit capacitance.

In combination with the first aspect or any one of the above possible implementation manner of the first aspect, in a seventh possible implementation manner of the first aspect, the comparator is specifically configured output a comparison result 1 in a case that the voltage value received by the first input end of the comparator is greater than or equal to the voltage value received by the second input end of the comparator; and output a comparison result 0 in a case that the voltage value received by the first input end of the comparator is less than the voltage value received by the second input end of the comparator.

The capacitive successive approximation analog-to-digital converter in above technical solutions may use 2N capacitors to implement outputting an N-bit binary code. Compared with the prior art, a number of capacitors used is reduced, so that a manufacturing cost of the capacitive successive approximation analog-to-digital converter may be reduced.

DESCRIPTION OF EMBODIMENTS

A description of technical solutions of the embodiments of the present application will be given below, in combination with the accompanying drawings in the embodiments of the present application.

Figure 1:
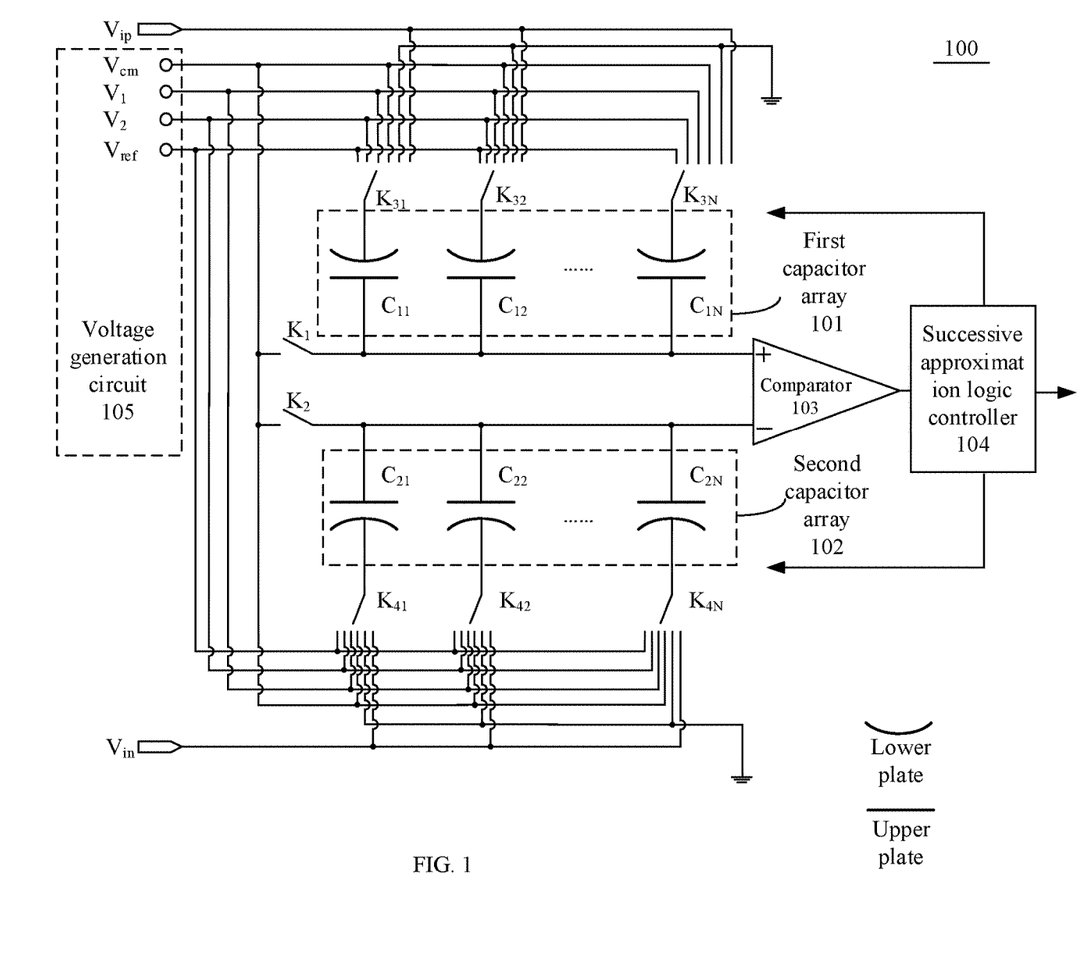
FIG. 1 is a schematic structural block diagram of a capacitive successive approximation analog-to-digital converter according to an embodiment of the present application.

FIG. 1 is a schematic structural block diagram of a capacitive successive approximation analog-to-digital converter according to an embodiment of the present application. The capacitance successive approximation analog-to-digital converter 100 shown in FIG. 1 includes a first capacitor array 101, a second capacitor array 102, a comparator 103, a successive approximation logic controller 104 and a voltage generation circuit 105. The capacitive successive approximation analog-to-digital converter shown in FIG. 1 further includes a first switch $K_1$, a second switch $K_2$, N third switches and N fourth switches.

The first capacitor array 101 includes N first capacitors. The second capacitor array 102 includes N second capacitors. N is a positive integer larger than or equal to 3. It should be noted that although a symbol "-|(-" of an electrolytic capacitor used to denote a capacitor in FIG. 1, the capacitor shown in FIG. 1 is not limited to an electrolytic capacitor. A purpose of using the symbol "-|(-" to denote a capacitor is only to distinguish upper and lower plates of the capacitor. As shown in FIG. 1, a "-|" side of the capacitor denotes an upper plate of the capacitor, and a "(-" side denotes a lower plate of the capacitor.

The N third switches are $K_{31}, K_{32}, \ldots, K_{3N}$, respectively; and the N fourth switches are $K_{41}, K_{42}, \ldots, K_{4N}$, respectively. The N first capacitors are $C_{11}, C_{12}, \ldots, C1N$, respectively, and the N second capacitors are $C_{21}, C_{22}, \ldots, C_{2N}$, respectively. For convenience of description, $K_{3n}$ used hereinafter denotes an $n^{th}$ third switch of the N third switches, $K_{4n}$ denotes an $n^{th}$ fourth switch of the N fourth switches, $C_{1n}$ denotes an $n^{th}$ first capacitor of the N first capacitors, and $C_{2n}$ denotes an $n^{th}$ second capacitor of the N second capacitors, where n=1, ..., N.

An upper plate of each of the N first capacitors in the first capacitor array 101 is connected to a first input end of the comparator 103 (i.e., the end that a symbol "+" is located in the comparator 103).

An upper plate of each of the N second capacitors in the second capacitor array 102 is connected to a second input end of the comparator 103 (i.e., the end that a symbol "−" is located in the comparator 103).

An output end of comparator 103 is connected to an input end of successive approximation logic controller 104.

The voltage generation circuit 105 is configured to generate a common mode voltage $V_{cm}$, a reference voltage $V_{ref}$, a first voltage $V_1$ and a second voltage $V_2$, where $V_1$ is determined according to $V_{cm}$ and $V_{ref}$, and $V_2$ is determined according to $V_{cm}$ and a ground voltage $V_{gnd}$. A first output end of the voltage generation circuit 105 outputs the first voltage, a second output end of the voltage generation circuit 105 outputs the second voltage, a third output end of the voltage generation circuit 105 outputs the common mode voltage, and a fourth output end of the voltage generation circuit 105 outputs the reference voltage.

The successive approximation logic controller 104 is configured to control $K_1$ to enable the upper plate of each of the N first capacitors to be connected to or disconnected from the third output end of the voltage generation circuit 105.

The successive approximation logic controller 104 is configured to control $K_2$ to enable the upper plate of each of the N second capacitors to be connected to or disconnected from the third output end of the voltage generation circuit 105 through $K_2$.

The successive approximation logic controller 104 is configured to control $K_{3n}$ to enable a lower plate of $C_{1n}$ to be connected to or disconnected from the first output end of the voltage generation circuit 105, the second output end of the voltage generation circuit 105, the third output end of the voltage generation circuit 105, the fourth output end of the voltage generation circuit 105, a ground end or an output end of a first sampling voltage $V_{ip}$.

The successive approximation logic controller 104 is configured to control $K_{4n}$ to enable a lower plate of $C_{2n}$ to be connected to or disconnected from the first output end of the voltage generation circuit 105, the second output end of the voltage generation circuit 105, the third output end of the voltage generation circuit 105, the fourth output end of the voltage generation circuit 105, the ground end or an output end of a second sampling voltage $V_{in}$.

The comparator 103 is configured to compare a voltage value received by the first input end of the comparator 103 with a voltage value received by the second input end of the comparator 103, determine N comparison results corresponding to an N-bit binary code and send these comparison results to the successive approximation logic controller 104.

The capacitive successive approximation analog-to-digital converter shown in FIG. 1 may use 2N capacitors to implement outputting an N-bit binary code. Compared with the prior art, a number of capacitors used is reduced, so that a manufacturing cost of the capacitive successive approximation analog-to-digital converter may be reduced.

Optionally, in some embodiments, the first voltage $V_1$ may be determined according to the formula $V_1=0.5\times(V_{cm}+V_{ref})$; the second voltage $V_2$ may be determined according to the formula $V_2=0.5\times(V_{cm}+V_{gnd})$.

The voltage generation circuit 105 only needs to be capable of generating $V_1$, $V_2$, $V_{cm}$, and $V_{ref}$. In specific implementation, one power supply and a plurality of amplifying circuits may be used, or a plurality of power supplies may also be used, which is not limited in the embodiment of the present application.

The reference voltage is determined specifically in a same manner as a reference voltage used in a current capacitive SAR ADC. For example, the reference voltage may be determined based on a power supply voltage. This embodiment of the present application is not limited hereto. Optionally, in some embodiments, the voltage generation circuit 105 may generate the reference voltage first and then determine the first voltage. Optionally, in other embodiments, the voltage generation circuit 105 may also directly generate the first voltage.

Further, the successive approximation logic controller 104 is specifically configured to: during a sampling period, control the first switch, the second switch, the N third switches and the N fourth switches to enable the N first capacitors and the N second capacitors to operate in a sampling mode; and after the sampling period is completed, control the first switch, the second switch, the N third switches and the N fourth switches to enable the N first capacitors and the N second capacitors to operate in an $n^{th}$ comparison mode.

The comparator 103 is specifically configured to, in a case that the N first capacitors and the N second capacitors operate in the $n^{th}$ comparison mode, compare the voltage value received by the first input end of the comparator 103 with the voltage value received by the second input end of the comparator 103, determine an $n^{th}$ comparison result of N comparison results and output the $n^{th}$ comparison result to the successive approximation logic controller 104, where the $n^{th}$ comparison result corresponds to an $(N-n+1)^{th}$ bit of the N-bit binary code.

Specifically, the successive approximation logic controller 104 is specifically configured to: during the sampling period, control $K_1$ to be turned on to enable an upper plate of each of the N first capacitors to be connected to a third output end of the voltage generation circuit (that is, connected to the common mode voltage $V_{cm}$), control $K_2$ to be turned on to enable an upper plate of each of the N second capacitors to be connected to the third output end of the voltage generation circuit (that is, connected to the common mode voltage $V_{cm}$), control the N third switches to enable a lower plate of each of the N first capacitors to be connected to an output end of the first sampling voltage, and control the N fourth switches to enable a lower plate of each of the N second capacitors to be connected to an output end of the second sampling voltage, so that the N first capacitors and the N second capacitors operate in the sampling mode.

The successive approximation logic controller 104 is specifically configured to: after the sampling period is completed, control $K_1$ to be turned off to enable the upper plate of each of the N first capacitors to be disconnected from the third output end of the voltage generation circuit, control $K_2$ to be turned off to enable the upper plate of each of the N second capacitors to be disconnected from the third output end of the voltage generation circuit, control the N third switches to enable the lower plate of each of the N first capacitors to be connected to the third output end of the voltage generation circuit (that is, connected to the common mode voltage $V_{cm}$), and control the N fourth switches to enable the lower plate of each of the N second capacitors to be connected to the third output end of the voltage generation circuit (that is, connected to the common mode voltage $V_{cm}$), so that the N first capacitors and the N second capacitors operate in a first comparison mode.

The successive approximation logic controller 104 is specifically configured to control connection states of the first capacitor array 101 and the second capacitor array 102 with the first voltage $V_1$ and the second voltage $V_2$ according to a first comparison result output by the comparator 103, that is, when the first comparison result is in a certain state or is a certain value, control the N third switches to enable a lower plate of each of the N first capacitors to be connected to a second output end of the voltage generation circuit (i.e., connected to the second voltage $V_2$), and control the N fourth switches to enable a lower plate of each of the N second capacitors to be connected to a first output end of the voltage generation circuit (i.e., connected to the first voltage $V_1$), or, when the first comparison result is in another certain state or is another certain value, control the N third switches to enable the lower plate of each of the N first capacitors to be connected to the first output end of the voltage generation circuit (i.e., connected to the first voltage $V_1$), and control the N fourth switches to enable the lower plate of each of the N second capacitors to be connected to the second output end of the voltage generation circuit (i.e., connected to the second voltage $V_2$), so that the N first capacitors and the N second capacitors operate in a second comparison mode.

The successive approximation logic controller 104 is specifically configured to, according to the first comparison result and an $(m-1)^{th}$ comparison result output by the comparator 103, control an $(m-2)^{th}$ third switch of the N third switches to enable a lower plate of an $(m-2)^{th}$ first capacitor of the N first capacitors to be connected to a ground end, a third output end of the voltage generation circuit or a fourth output end of the voltage generation circuit, and control an $(m-2)^{th}$ fourth switch of the N fourth switches to enable a lower plate of an $(m-2)^{th}$ second capacitor of the N second capacitors to be connected to the ground end, the third output end of the voltage generation circuit or the fourth output end of the voltage generation circuit, so that the N first capacitors and the N second capacitors operate in an $m^{th}$ comparison mode, where $m=3, \ldots, N$.

The comparator 103 may provide two solutions for outputting comparison results. Solution one: the output comparison result is 1 in a case that a voltage value received by the first input end of the comparator 103 is greater than or equal to a voltage value received by the second input end of the comparator 103; the output comparison result is 0 in a case that the voltage value received by the first input end of the comparator 103 is less than the voltage value received by the second input end of the comparator 103. Solution two: the output comparison result is 0 in a case that a voltage value received by the first input end of the comparator 103 is greater than or equal to a voltage value received by the second input end of the comparator 103; the output comparison result is 1 in a case that the voltage value received by the first input end of the comparator 103 is less than the voltage value received by the second input end of the comparator 103. In the embodiment of the present application, the comparators 103 outputs the comparison results by using the solution one.

In a case that the N first capacitors and the N second capacitors operate in the first comparison mode, the comparator 103 may output the first comparison result. The successive approximation logic controller 104 is specifically configured to: in a case that the first comparison result output by the comparator 103 is 1, control the N third switches to enable the lower plate of each of the N first capacitors to be connected to a second output end of the voltage generation circuit 105, and control the N fourth switches to enable the lower plate of each of the N second capacitors to be connected to a first output end of the voltage generation circuit 105, so that the N first capacitors and the N second capacitors operate in the second comparison mode; and in a case that the first comparison result output by the comparator 103 is 0, control the N third switches to enable the lower plate of each of the N first capacitors to be connected to the first output end of the voltage generation circuit 105, and control the N fourth switches to enable the lower plate of each of the N second capacitors to be connected to the second output end of the voltage generation circuit, so that the N first capacitors and the N second capacitors operate in the second comparison mode.

In a case that the N first capacitors and the N second capacitors operate in an $(m-1)^{th}$ comparison mode, the comparator 103 may output an $(m-1)^{th}$ comparison result. The successive approximation logic controller 104 is specifically configured to: in a case that the first comparison result output by the comparator 103 is 1 and the $(m-1)^{th}$ output result output by the comparator 103 is 1, control an $(m-2)^{th}$ third switch of the N third switches to enable a lower plate of the $(m-2)^{th}$ first capacitor of the N first capacitors to be connected to a ground end, and control the $(m-2)^{th}$ fourth switch of the N fourth switches to enable a lower plate of the $(m-2)^{th}$ second capacitor of the N second capacitors to be connected to a fourth output end of the voltage generation circuit 105; in a case that the first comparison result output by the comparator 103 is 1 and the $(m-1)^{th}$ output result output by the comparator 103 is 0, control an $(m-2)^{th}$ third switch of the N third switches to enable a lower plate of an $(m-2)^{th}$ first capacitor of the N first capacitors to be connected to a third output end of the voltage generation circuit 105, and control an $(m-2)^{th}$ fourth switch of the N fourth switches to enable a lower plate of an $(m-2)^{th}$ second capacitor of the N second capacitors to be connected to the third output end of the voltage generation circuit 105; in a case that the first comparison result output by the comparator 103 is 0 and the $(m-1)^{th}$ output result output by the comparator 103 is 1, control the $(m-2)^{th}$ third switch of the N third switches to enable the lower plate of the $(m-2)^{th}$ first capacitor of the N first capacitors to be connected to a third output end of the voltage generation circuit 105, and control the $(m-2)^{th}$ fourth switch of the N fourth switches to enable the lower plate of the $(m-2)^{th}$ second capacitor of the N second capacitors to be connected to the third output end of the voltage generation circuit 105; in a case that the first comparison result output by the comparator 103 is 0 and the $(m-1)^{th}$ output result output by the comparator 103 is 0, control the $(m-2)^{th}$ third switch of the N third switches to enable the lower plate of the $(m-2)^{th}$ first capacitor of the N first capacitors to be connected to the fourth output end of the voltage generation circuit 105, and control the $(m-2)^{th}$ fourth switch of the N fourth switches to enable the lower plate of the $(m-2)^{th}$ second capacitor of the N second capacitors to be connected to the ground end, so that the N first capacitors and the N second capacitors operate in the $m^{th}$ comparison mode, where $m=3, \ldots, N$.

A capacitance of a first one of the N first capacitors is C, a capacitance of a $k^{th}$ one of the N first capacitors is $2^{k-2}C$, a capacitance of a first one of the N second capacitors is C, and a capacitance of a $k^{th}$ one of the N second capacitors is $2^{k-2}C$, where $k=2, \ldots, N$, and C is a unit capacitance. Therefore, based on the above technical solution, a total capacitance in the first capacitor array is $2^{N-1}C$. In the prior art, a total capacitance in one capacitor array is $2^{N}C$. Therefore, the above technical solution can effectively reduce the total capacitance of the capacitor used in the capacitive SAR ADC. To sum up, the capacitive SAR ADC provided by the above technical solution can output an output result in same number of bits even the number of capacitors used and the total capacitance are both reduced.

The successive approximation logic controller 104 may output the N-bit binary code based on the N comparison results output by the comparator 103. Specifically, the $n^{th}$ comparison result output by the comparator 103 corresponds to an $(N-n+1)^{th}$ bit of the N-bit binary code. Therefore, if a solution of output comparison result used by the comparator 103 is solution one, the successive approximation logic controller 104 needs to output obtained N comparison results in a reversed order, to obtain the N-bit binary code. If a solution of output comparison result used by the comparator 103 is solution two, the successive approximation logic controller 104 needs to output obtained N comparison results in a reversed order and perform an inversion operation on the output results, to obtain the N-bit binary code.

To facilitate a person skilled in the art to better understand the technical solutions provided by the embodiments of the present application, the embodiments of the present application will be further described below in combination with Table 1 and Table 2. As described above, a number of capacitors in the second capacitor array is the same as a number of capacitors in the first capacitor. A specific operating process of the capacitors in the second capacitor array is the same as the operating process of the capacitors in the first capacitor array. The difference is that ports that are connected to an upper plate and a lower plate of the capacitor are different. Therefore, in order to avoid redundancy, an embodiment shown in Table 1 and Table 2 only show a connection relationship of the upper and lower plates of the first capacitor in the first capacitor array in different states.

Table 1 is schematic illustration of the upper plate of each of the capacitors in the first capacitor array in different states. For convenience of description, it is assumed that N is 5 in the embodiment of Table 1 and Table 2.

TABLE 1

| | Capacitor | | | | |
|---|---|---|---|---|---|
| State | $C_{11}$ | $C_{12}$ | $C_{13}$ | $C_{14}$ | $C_{15}$ |
| $S_0$ | $V_{c1}, V_{cm}$ | $V_{c1}, V_{cm}$ | $V_{c1}, V_{cm}$ | $V_{c1}, V_{cm}$ | $V_{c1}, V_{cm}$ |
| $S_1$ | $V_{c1}$ | $V_{c1}$ | $V_{c1}$ | $V_{c1}$ | $V_{c1}$ |
| $S_2$ | $V_{c1}$ | $V_{c1}$ | $V_{c1}$ | $V_{c1}$ | $V_{c1}$ |
| $S_3$ | $V_{c1}$ | $V_{c1}$ | $V_{c1}$ | $V_{c1}$ | $V_{c1}$ |
| $S_4$ | $V_{c1}$ | $V_{c1}$ | $V_{c1}$ | $V_{c1}$ | $V_{c1}$ |
| $S_5$ | $V_{c1}$ | $V_{c1}$ | $V_{c1}$ | $V_{c1}$ | $V_{c1}$ |

$S_0$ denotes that five first capacitors, $C_{11}$ to $C_{15}$, in the first capacitor array operate in a sampling mode. $S_1$ to $S_5$ denote that the five first capacitors in the first capacitor array operate in the first to fifth comparison modes. $V_{c1}$ denotes that the first input end of the comparator is connected to the upper plate of the capacitor, and $V_{cm}$ denotes that the output end of the voltage generation circuit output $V_{cm}$ is connected to the upper plate of the capacitor.

As shown in Table 1, in a case that the five first capacitors in the first capacitor array operate in the sampling mode, the upper plate of each of the first capacitors are connected to the first input end of the comparator and an output end that the voltage generation circuit outputs $V_{cm}$. In a case that the five first capacitors in the first capacitor array operate in the five comparison modes, the upper plate of each of the first capacitors are connected to the first input end of the comparator.

Specifically, if an output result of the comparator is 1 in the first comparison mode, the lower plates of the five first capacitors are all connected to the second output end of the voltage generation circuit. On such a basis, if an output result of the comparator is 0 in a second comparison mode, the lower plate of the first one of the five first capacitors is connected to the output end that outputs a common mode voltage in the voltage generation circuit. Further, if an output result of the comparator is 1 in a third comparison mode, the lower plate of the second one of the five first capacitors is connected to the ground end. Further, if an output result of the comparator is 0 in the third comparison mode, the lower plate of the third one of the five first capacitors is connected to the output end that outputs a common mode voltage in the voltage generation circuit.

For ease of understanding, Table 2 shows schematic illustration of lower plate of each capacitor in the first capacitor array in different states when the first to fourth comparison results output by the comparator is 1010.

TABLE 2

| | Capacitor | | | | |
|---|---|---|---|---|---|
| State | $C_{11}$ | $C_{12}$ | $C_{13}$ | $C_{14}$ | $C_{15}$ |
| $S_0$ | $V_{ip}$ | $V_{ip}$ | $V_{ip}$ | $V_{ip}$ | $V_{ip}$ |
| $S_1$ | $V_{cm}$ | $V_{cm}$ | $V_{cm}$ | $V_{cm}$ | $V_{cm}$ |
| $S_2$ | $V_2$ | $V_2$ | $V_2$ | $V_2$ | $V_2$ |
| $S_3$ | $V_{cm}$ | $V_2$ | $V_2$ | $V_2$ | $V_2$ |
| $S_4$ | $V_{cm}$ | $V_{gnd}$ | $V_2$ | $V_2$ | $V_2$ |
| $S_5$ | $V_{cm}$ | $V_{gnd}$ | $V_{cm}$ | $V_2$ | $V_2$ |

$S_0$ denotes that five first capacitors, $C_{11}$ to $C_{15}$, in the first capacitor array operate in a sampling mode. $S_1$ to $S_5$ denote that the five first capacitors in the first capacitor array operate in the first to fifth comparison modes. $V_{ip}$ denotes that an output end that outputs the first sampling voltage $V_{ip}$ is connected to the lower plate of the capacitor, $V_{cm}$ denotes that an output end that the voltage generation circuit outputs the common mode voltage $V_{cm}$ is connected to the lower plate of the capacitor, $V_1$ denotes that an output end that the voltage generation circuit outputs the second voltage $V_2$ is connected to the lower plate of the capacitor, and $V_{gnd}$ denotes that the ground end is connected to the lower plate of the capacitor.

In addition, only the port connected to the lower plates of the $(m-2)^{th}$ first and second capacitors is controlled according to the first comparison result and the $(m-1)^{th}$ output result output by the comparator. The ports connected to the lower plates of other capacitors of the N first capacitors remain unchanged.

Optionally, in other embodiments, the capacitive successive approximation analog-to-digital converter may also include only one of the first capacitor array and the second capacitor array as shown in FIG. 1. One input end of the comparator is connected to the upper plate of the capacitor array, and the other input is connected to a port that outputs a common mode voltage in the voltage generation circuit.

Figure 2:
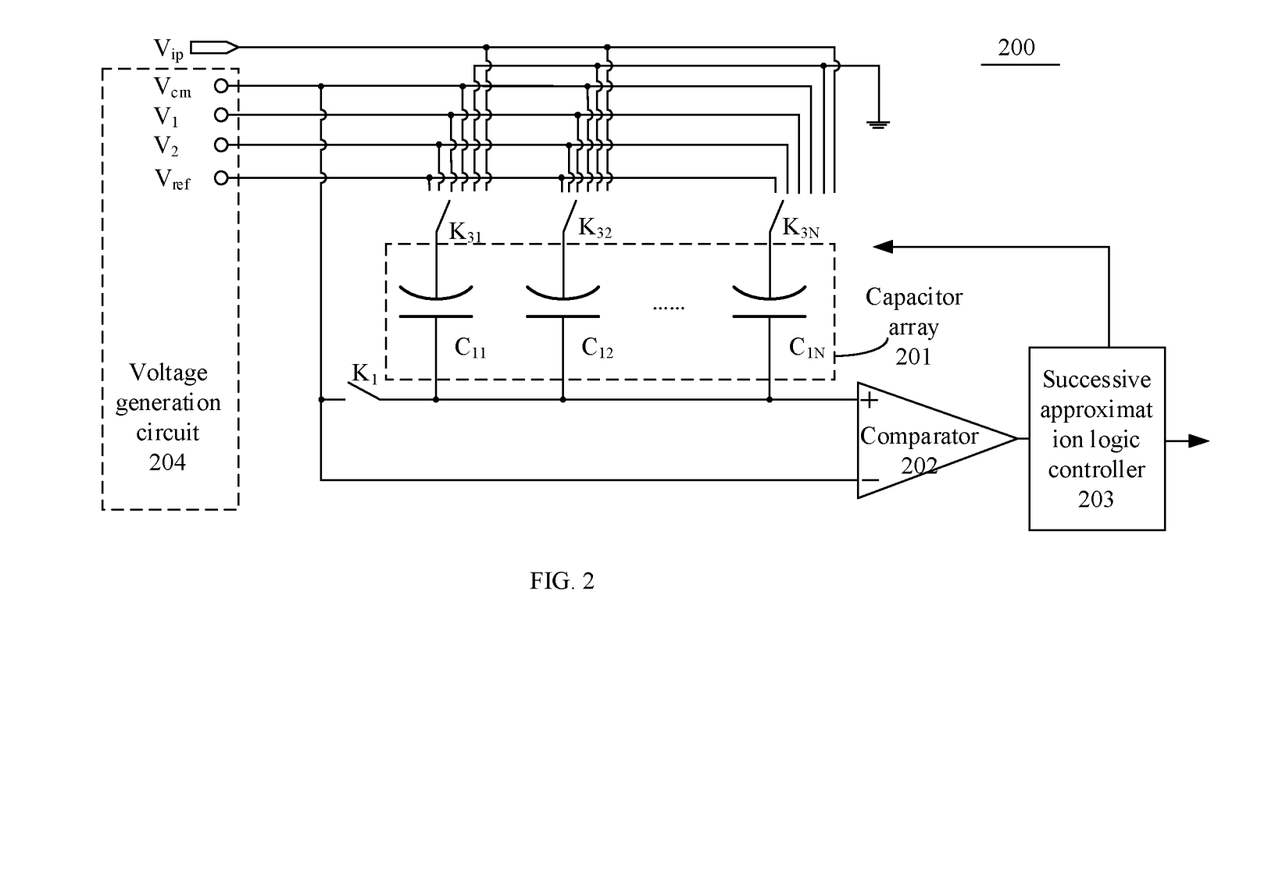
FIG. 2 is a schematic structural block diagram of another capacitive successive approximation analog-to-digital converter according to an embodiment of the present application.

For example, FIG. 2 is a schematic structural block diagram of another capacitive successive approximation analog-to-digital converter according to an embodiment of the present application. A capacitance successive approximation analog-to-digital converter 200 shown in FIG. 2 includes a capacitor array 201, a comparator 202, a successive approximation logic controller 203, a voltage generation circuit 204, a first switch K₁ and N third switches. The capacitor array shown in FIG. 2 is the capacitor array 101 shown in FIG. 1. The capacitive successive approximation analog-to-digital converter 200 shown in FIG. 2 differs from the capacitive successive approximation analog-to-digital converter 100 shown in FIG. 1 only in that, the second input end of the comparator 202 is connected to a port that outputs a common mode voltage in the voltage generation circuit in the capacitive successive approximation analog-to-digital converter 200 shown in FIG. 2. The operating mode and connection relationship of each component in the capacitive successive approximation analog-to-digital converter 200 are the same as those of each component in the capacitive successive approximation analog-to-digital converter 100 shown in FIG. 1, and thus will not be described redundantly herein.

Figure 3:
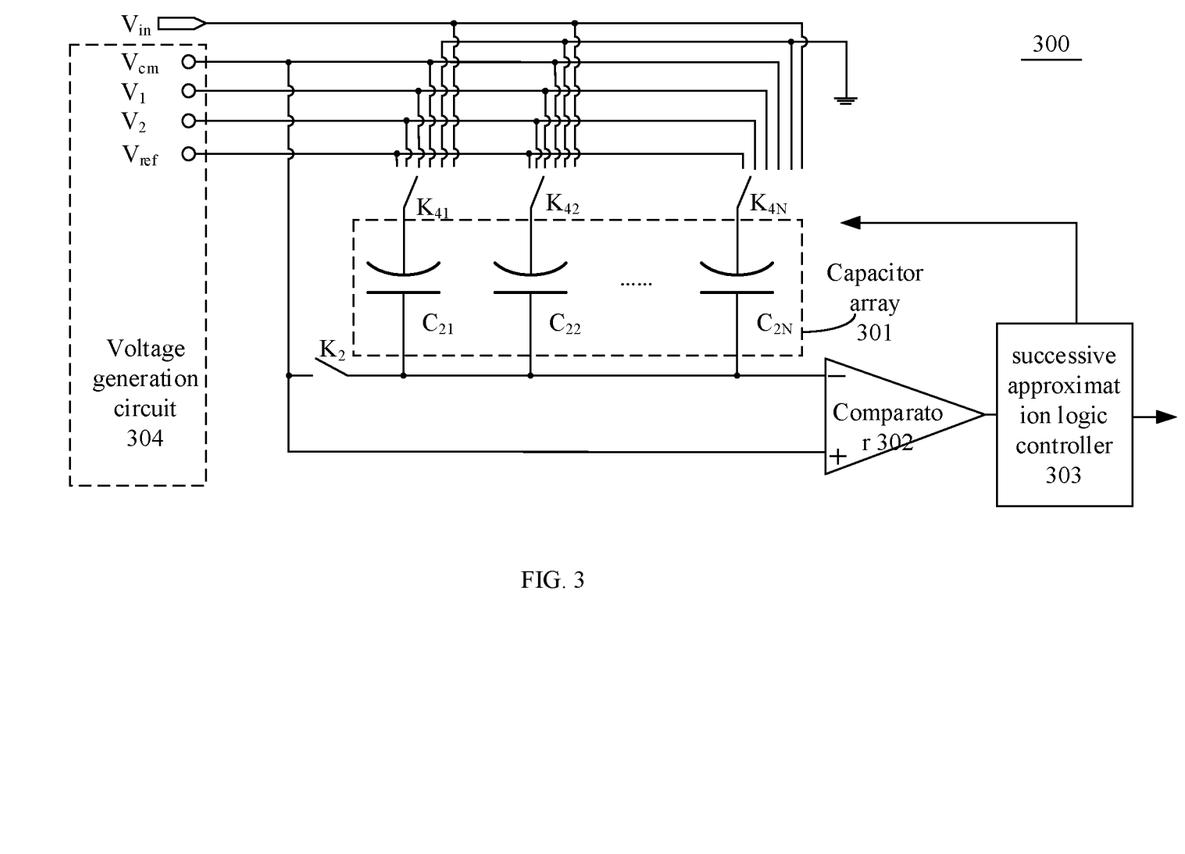
FIG. 3 is a schematic structural block diagram of yet another capacitive successive approximation analog-to-digital converter according to an embodiment of the present application.

For another example, FIG. 3 is a schematic structural block diagram of yet another capacitive successive approximation analog-to-digital converter according to an embodiment of the present application. A capacitance successive approximation analog-to-digital converter 300 shown in FIG. 3 includes a capacitor array 301, a comparator 302, a successive approximation logic controller 303, a voltage generation circuit 304, a second switch K2 and N fourth switches. The capacitor array shown in FIG. 3 is the capacitor array 102 shown in FIG. 1. The capacitive successive approximation analog-to-digital converter 300 shown in FIG. 3 differs from the capacitive successive approximation analog-to-digital converter 100 shown in FIG. 1 only in that, the first input end of the comparator 302 is connected to a port that outputs a common mode voltage in the voltage generation circuit in the capacitive successive approximation analog-to-digital converter 300 shown in FIG. 3. The operating mode and connection relationship of each component in the capacitive successive approximation analog-to-digital converter 300 are the same as those of each component in the capacitive successive approximation analog-to-digital converter 100 shown in FIG. 1, and thus will not be described redundantly herein.

Compared with the capacitive successive approximation analog-to-digital converter 100 shown in FIG. 1, the capacitive successive approximation analog-to-digital converters in FIG. 2 and FIG. 3 use fewer capacitors. Compared with the capacitive successive approximation analog-to-digital converters shown in FIG. 2 and FIG. 3, the capacitive successive approximation analog-to-digital converter 100 shown in FIG. 1 uses more capacitors; however, the capacitive successive approximation analog-to-digital converter 100 in FIG. 1 is higher in accuracy.

In the embodiments provided in the present application, it should be understood that the disclosed apparatus may be implemented in other manners. For example, the apparatus embodiments described above are merely exemplary, e.g., the division of the units is merely a logic function division, other division manners may exist in practical implementation, for example, a plurality of units or components may be combined or integrated to another system.

The foregoing description is only the specific implementation of the present application, but the protection scope of the present application is not limited thereto, those skilled who are familiar with the art could readily think of variations or substitutions within the technical scope disclosed by the present application, and these variations or substitutions shall fall within the protection scope of the present application. Therefore, the protection scope of the present application should prevail over the protection scope of the present application.

What is claimed is:

1. A capacitive successive approximation analog-to-digital converter, comprising:
   a first capacitor array comprising N first capacitors, wherein N is a number of bits of a binary code output by the capacitive successive approximation analog-to-digital converter, and N is a positive integer greater than or equal to 3;
   a second capacitor array comprising N second capacitors;
   a voltage generation circuit configured to generate a common mode voltage, a reference voltage, a first voltage and a second voltage, wherein the first voltage is determined according to the common mode voltage and the reference voltage, and the second voltage is determined according to the common mode voltage and a ground voltage;
   a first switch connected between the voltage generation circuit and upper plates of the N first capacitors;
   a second switch connected between the voltage generation circuit and upper plates of the N second capacitors;
   N third switches correspondingly connected to lower plates of the N first capacitors respectively to control connections of the lower plates of the first capacitors with the voltage generation circuit and an output end of a first sampling voltage;
   N fourth switches correspondingly connected to lower plates of the N second capacitors respectively to control connections of the lower plates of the first capacitors with the voltage generation circuit and an output end of a second sampling voltage;
   a comparator comprising a first input end, a second input end and an output end, wherein the upper plates of the N first capacitors are connected to the first input end and the upper plates of the N second capacitors are connected to the second input end, and the comparator is configured to compare a voltage value received by the first input end with a voltage value received by the second input end and output N comparison results respectively corresponding to an N-bit binary code outputted via the output end of the comparator; and
   a successive approximation logic controller connected to the output end of the comparator to control the first switch, the second switch, the N third switches and the N fourth switches to enable the first capacitor array and the second capacitor array to be in a sampling mode or a comparison mode.

2. The capacitive successive approximation analog-to-digital converter of claim 1, wherein the first voltage is determined according to the following formula:

$$V_1=0.5\times(V_{cm}+V_{ref}),$$

wherein $V_1$ denotes the first voltage, $V_{cm}$ denotes the common mode voltage, and $V_{ref}$ denotes the reference voltage; and the second voltage is determined according to the following formula:

$$V_2=0.5\times(V_{cm}+V_{gnd}),$$

wherein $V_2$ denotes the second voltage and $V_{gnd}$ denotes a ground voltage.

3. The capacitive successive approximation analog-to-digital converter of claim 1, wherein the successive approximation logic controller is configured to control the first switch, the second switch, the N third switches and the N fourth switches during a sampling period to enable the N first capacitors and the N second capacitors to operate in a sampling mode.

4. The capacitive successive approximation analog-to-digital converter of claim 3, wherein the successive approximation logic controller is configured to, after the sampling period is completed, control the first switch, the second switch, the N third switches and the N fourth switches to enable the N first capacitors and the N second capacitors to operate in an $n^{th}$ comparison mode, wherein n=1, ..., N; and the comparator is configured to, in a case that the N first capacitors and the N second capacitors operate in the $n^{th}$ comparison mode, compare the voltage value received by the first input end of the comparator with the voltage value received by the second input end of the comparator, determine an $n^{th}$ comparison result of the N comparison results and output the $n^{th}$ comparison result to the successive approximation logic controller, wherein the $n^{th}$ comparison result corresponds to an $(N-n+1)^{th}$ bit of the N-bit binary code.

5. The capacitive successive approximation analog-to-digital converter of claim 4, wherein the successive approximation logic controller is configured to:

during the sampling period, control the first switch to be turned on to enable an upper plate of each of the N first capacitors to be connected to a third output end of the voltage generation circuit, control the second switch to be turned on to enable an upper plate of each of the N second capacitors to be connected to the third output end of the voltage generation circuit, control the N third switches to enable a lower plate of each of the N first capacitors to be connected to an output end of the first sampling voltage, and control the N fourth switches to enable a lower plate of each of the N second capacitors to be connected to an output end of the second sampling voltage, so that the N first capacitors and the N second capacitors operate in the sampling mode, and the third output end of the voltage generation circuit outputs the common mode voltage.

6. The capacitive successive approximation analog-to-digital converter of claim 5, wherein the successive approximation logic controller is configured to:

after the sampling period is completed, control the first switch to be turned off to enable the upper plate of each of the N first capacitors to be disconnected from the third output end of the voltage generation circuit, control the second switch to be turned off to enable the upper plate of each of the N second capacitors to be disconnected from the third output end of the voltage generation circuit, control the N third switches to enable the lower plate of each of the N first capacitors to be connected to the third output end of the voltage generation circuit, and control the N fourth switches to enable the lower plate of each of the N second capacitors to be connected to the third output end of the voltage generation circuit, so that the N first capacitors and the N second capacitors operate in a first comparison mode;

according to a first comparison result output by the comparator, control the N third switches to enable the lower plate of each of the N first capacitors to be connected to a second output end of the voltage generation circuit and control the N fourth switches to enable the lower plate of each of the N second capacitors to be connected to a first output end of the voltage generation circuit, or, control the N third switches to enable the lower plate of each of the N first capacitors to be connected to a first output end of the voltage generation circuit and control the N fourth switches to enable the lower plate of each of the N second capacitors to be connected to a second output end of the voltage generation circuit, so that the N first capacitors and the N second capacitors operate in a second comparison mode; and according to the first comparison result and an $(m-1)^{th}$ comparison result output by the comparator, control an $(m-2)^{th}$ third switch of the N third switches to enable a lower plate of an $(m-2)^{th}$ first capacitor of the N first capacitors to be connected to a ground end, the third output end of the voltage generation circuit or a fourth output end of the voltage generation circuit, control an $(m-2)^{th}$ fourth switch of the N fourth switches to enable a lower plate of an $(m-2)^{th}$ second capacitor of the N second capacitors to be connected to the ground end, the third output end of the voltage generation circuit or the fourth output end of the voltage generation circuit, so that the N first capacitors and the N second capacitors operate in an $m^{th}$ comparison mode, wherein m=3, ..., N, wherein the first output end of the voltage generation circuit outputs the first voltage, the second output end of the voltage generation circuit outputs the second voltage, and the fourth output end of the voltage generation circuit outputs the reference voltage.

7. The capacitive successive approximation analog-to-digital converter of claim 1, wherein a capacitance of a first one of the N first capacitors is C, a capacitance of a $k^{th}$ one of the N first capacitors is $2^{k-2}C$, a capacitance of a first one of the N second capacitors is C, and a capacitance of a $k^{th}$ one of the N second capacitors is $2^{k-2}C$, wherein k=2, ..., N, and C is a unit capacitance.

8. The capacitive successive approximation analog-to-digital converter of claim 1, wherein the comparator is configured to output a comparison result 1 in a case that the voltage value received by the first input end of the comparator is greater than or equal to the voltage value received by the second input end of the comparator; and output a comparison result 0 in a case that the voltage value received by the first input end of the comparator is less than the voltage value received by the second input end of the comparator.

* * * * *